(12) United States Patent
Zilbauer et al.

(10) Patent No.: US 8,016,945 B2
(45) Date of Patent: Sep. 13, 2011

(54) HAFNIUM OXIDE ALD PROCESS

(75) Inventors: Thomas Zilbauer, Munich (DE); Ignaz Eisele, Icking (DE); Jan Matusche, Dresden (DE); Ursula Ingeborg Schmidt, Dresden (DE)

(73) Assignee: Applied Materials, Inc., Santa Clara, CA (US)

( * ) Notice: Subject to any disclaimer, the term of this patent is extended or adjusted under 35 U.S.C. 154(b) by 811 days.

(21) Appl. No.: 11/963,068

(22) Filed: Dec. 21, 2007

(65) Prior Publication Data

US 2009/0162551 A1 Jun. 25, 2009

(51) Int. Cl.
| | |
|---|---|
| C23C 16/06 | (2006.01) |
| C23C 16/14 | (2006.01) |
| C23C 16/18 | (2006.01) |
| C23C 16/455 | (2006.01) |
| C23C 16/52 | (2006.01) |
| C23C 16/44 | (2006.01) |

(52) U.S. Cl. ............... 118/715; 118/720; 427/126.1; 427/248.1

(58) Field of Classification Search ............... 118/715, 118/720
See application file for complete search history.

(56) References Cited

U.S. PATENT DOCUMENTS

| | | | |
|---|---|---|---|
| 6,680,420 B2 | 1/2004 | Pang et al. | |
| 6,772,072 B2 | 8/2004 | Ganguli et al. | |
| 6,830,618 B2 * | 12/2004 | Hara et al. | 117/200 |
| 6,869,638 B2 * | 3/2005 | Baum et al. | 427/126.1 |
| 6,930,059 B2 | 8/2005 | Conley, Jr. et al. | |
| 6,955,211 B2 | 10/2005 | Ku et al. | |
| 7,038,284 B2 | 5/2006 | Haukka et al. | |
| 7,041,609 B2 | 5/2006 | Vaartstra | |
| 7,199,023 B2 | 4/2007 | Ahn et al. | |
| 2002/0007790 A1 * | 1/2002 | Park | 118/715 |
| 2002/0175393 A1 * | 11/2002 | Baum et al. | 257/506 |
| 2002/0187644 A1 * | 12/2002 | Baum et al. | 438/700 |
| 2003/0121608 A1 | 7/2003 | Chen et al. | |
| 2003/0207593 A1 | 11/2003 | Derderian et al. | |
| 2004/0043149 A1 | 3/2004 | Gordon et al. | |
| 2004/0198069 A1 | 10/2004 | Metzner et al. | |
| 2005/0095859 A1 | 5/2005 | Chen et al. | |
| 2005/0271813 A1 | 12/2005 | Kher et al. | |
| 2006/0172485 A1 | 8/2006 | Vaartstra | |
| 2006/0261397 A1 | 11/2006 | Ahn et al. | |
| 2006/0270147 A1 | 11/2006 | Ahn et al. | |
| 2006/0270223 A1 | 11/2006 | Millward | |
| 2007/0079759 A1 | 4/2007 | Lee et al. | |
| 2007/0090439 A1 | 4/2007 | Ahn et al. | |
| 2007/0235085 A1 | 10/2007 | Nakashima et al. | |

OTHER PUBLICATIONS

International Search Report and Written Opinion of the International Searching Authority mailed May 22, 2009 in PCT/US2008/087441.

* cited by examiner

*Primary Examiner* — Rudy Zervigon
(74) *Attorney, Agent, or Firm* — Patterson & Sheridan, L.L.P.

(57) ABSTRACT

A method and apparatus for performing ALD deposition of hafnium oxide on a substrate is provided. The apparatus includes a process chamber, a precursor delivery subsystem, an oxidizer delivery subsystem, a purge gas subsystem, a solvent flush subsystem, and optional solvent recovery and purification subsystems. The method includes pulsing precursor compounds into the process chamber in sequence. While one precursor is pulsed, purge gas is provided through the other precursor line. After pulsing, precursor lines are purged, and the chamber is evacuated and purged. A solvent flush step is employed to remove precursor deposits that build up in piping over time.

7 Claims, 7 Drawing Sheets

HAFNIUM OXIDE ALD PROCESS

BACKGROUND OF THE INVENTION

1. Field of the Invention

Embodiments of the present invention generally relate to a process for depositing thin films in semiconductor manufacturing. More particularly, embodiments of the present invention relate to a process for depositing hafnium oxide on a substrate by atomic layer deposition.

2. Description of the Related Art

For more than half a century, the semiconductor industry has followed Moore's Law, which states that the density of transistors on an integrated circuit doubles about every two years. Continued evolution of the industry along this path will require smaller features patterned onto substrates. Stack transistors currently in production have dimensions of 50 to 100 nanometers (nm). The next generation of devices will have dimensions of about 40 nm, and design efforts are being directed toward devices with dimension of 20 nm and smaller. As devices grow smaller, the aspect ratio (ratio of height to width) of features patterned on substrates grows higher. Devices currently in production may have features with aspect ratio up to about 10:1, but future devices will require aspect ratios potentially up to 100:1.

Increasing aspect ratios and shrinking devices pose challenges to deposition processes. Particularly challenging is the need for conformal deposition of layers on substrates having very high aspect ratios. Conventional deposition processes, such as chemical or physical vapor deposition, do not achieve the necessary uniformity of thickness covering features with high aspect ratio. Trenches and side walls are insufficiently covered, while tops of towers are covered to the point of bridging across to adjacent features creating voids beneath.

Atomic layer deposition (ALD) was invented to address these challenges. As described in U.S. Pat. No. 7,067,439, Metzner, et al, ALD is a variation of chemical vapor deposition wherein the reactants are provided to the reaction area separately, and the reaction is catalyzed by the surface of the substrate. A first precursor material is generally pulsed into the reactor, allowed to adsorb onto the surface, and then purged from the reactor, and then a second precursor is pulsed into the reactor. The second precursor material reacts with the first precursor material adsorbed onto the surface to produce a fraction of a molecular layer on the substrate. More precursors may be provided, each adding a fraction of the molecular layer, until the last precursor adds the final portion to complete a molecular layer of the desired substance on the substrate. The process is generally repeated until a desired thickness is obtained.

ALD is said to be "self-limiting." That is, ALD "half-reactions" proceed until the available reaction sites are used up, after which no more precursor reacts. In this way, the surface catalysis aspect of ALD ensures the deposited layer is absolutely uniform in thickness. ALD achieves conformal deposition on high aspect ratio features because surface reaction sites are an ingredient of the reaction, and are consumed by the reaction. Although it enhances throughput, an advantage of ALD processes is that uniform homogeneous concentrations are not necessary in the reaction space to achieve conformal deposition. It is merely necessary to provide enough of each precursor to consume substantially all available surface sites.

Variations of ALD processes may involve multiple precursors and may use any number of chemical pathways. Oxidation pathways, using an alkylamino metal precursor and an oxidizing agent, are popular for depositing oxide layers. Reduction pathways, using a metal halide precursor and a reducing agent, are also popular for depositing metal layers. Layers of mixed chemistry, such as nitrides, oxynitrides, and the like, may also be deposited by using two or more chemical precursors sequentially pulsed into the reaction chamber. Other variations on the process itself feature pumping out the reaction chamber to high vacuum between pulses, or continuously purging the reaction chamber with a non-reactive gas while pulsing reactants through the reaction space.

ALD processes are difficult to manage. It is desired that precursors react on the surface of the substrate, not in the space above the substrate, to achieve a self-limiting surface reaction. Thus, one precursor must be completely removed from the chamber before another precursor is pulsed into the chamber. Trace amounts of precursors lingering in feed lines and head spaces react to produce compounds that deposit on chamber and piping walls, potentially resulting in contamination of the substrate surface with impurities or imperfections. Some precursors have affinity for chamber materials, making it difficult and time consuming to evacuate them from the chamber. Moisture or oxygen impurities in any materials used as precursors or purge gases are particularly undesirable in an ALD process. Complicating the task of managing these challenges is the fact that process features such as valves and seals leak, and the smallest leaks in an ALD process can seriously degrade the results obtained.

Thus, there is a need for an ALD process and delivery system to manage these challenges.

SUMMARY OF THE INVENTION

Embodiments of the present invention generally provide a precursor delivery system for a deposition chamber, comprising one or more precursor delivery pathways coupled to the chamber; one or more oxidizer delivery pathways coupled to the chamber; one or more purge gas pathways coupled to the one or more precursor delivery pathways and the one or more oxidizer delivery pathways; and one or more solvent flush pathways coupled to the one or more precursor delivery pathways.

Other embodiments of the present invention provide a method of forming a layer on a substrate in a process chamber, comprising providing a precursor to the process chamber through a precursor delivery pathway; reacting the precursor with the substrate to deposit a layer on the substrate; and flushing the precursor pathway with a solvent.

Further embodiments of the present invention provide an apparatus for depositing material on a substrate in a process chamber, comprising one or more precursor delivery pathways connected to the process chamber; one or more oxidizer delivery pathways connected to the process chamber; one or more purge gas pathways connected to the one or more precursor delivery pathways and the one or more oxidizer delivery pathways; one or more solvent flush pathways connected to the one or more precursor delivery pathways; at least one solvent recovery unit coupled to the one or more precursor delivery pathways; and at least one purification system coupled to the one or more precursor delivery pathways.

Further embodiments of the present invention provide a method of forming a layer on a substrate in a process chamber, comprising pulsing a first material into the process chamber through a first pathway, wherein the first pathway is heated; pulsing a second material into the process chamber through a second pathway; purging the second pathway into the process chamber while pulsing the first material; and flushing the first pathway away from the process chamber with a solvent.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a process for forming a layer of hafnium oxide on a substrate using an atomic layer deposition process. In one embodiment, a hafnium precursor is pulsed to a process chamber containing a substrate and allowed to adsorb onto the substrate. Any excess precursor is pumped out of the chamber and the chamber is purged with a non-reactive or inert gas. An oxidizing precursor is pulsed into the chamber and allowed to react with the adsorbed hafnium precursor to form an atomic layer of hafnium oxide on the substrate. Any excess oxidizing precursor is pumped out of the chamber and the chamber purged again. The process is repeated until the hafnium oxide layer reaches a desired thickness.

A delivery system is provided by embodiments of the present invention. In one embodiment, the delivery system comprises a precursor delivery subsystem, an oxidizer delivery subsystem, a purge delivery subsystem, a solvent delivery subsystem, and a controller. The precursor delivery subsystem comprises one or more precursor delivery pathways, and delivers hafnium precursor to the process chamber as a vapor. The oxidizer delivery subsystem comprises one or more oxidizer delivery pathways, and delivers oxidizer to the process chamber as a vapor. The purge delivery subsystem comprises one or more purge gas pathways coupled to the precursor and oxidizer delivery pathways, and routes purge gas through portions of the precursor and oxidizer delivery subsystems, and through the process chamber. The solvent delivery subsystem comprises one or more solvent flush pathways coupled to the precursor delivery pathways, and routes solvent through portions of the precursor delivery subsystem. The solvent delivery subsystem may include recovery and purification components.

Figure 1:
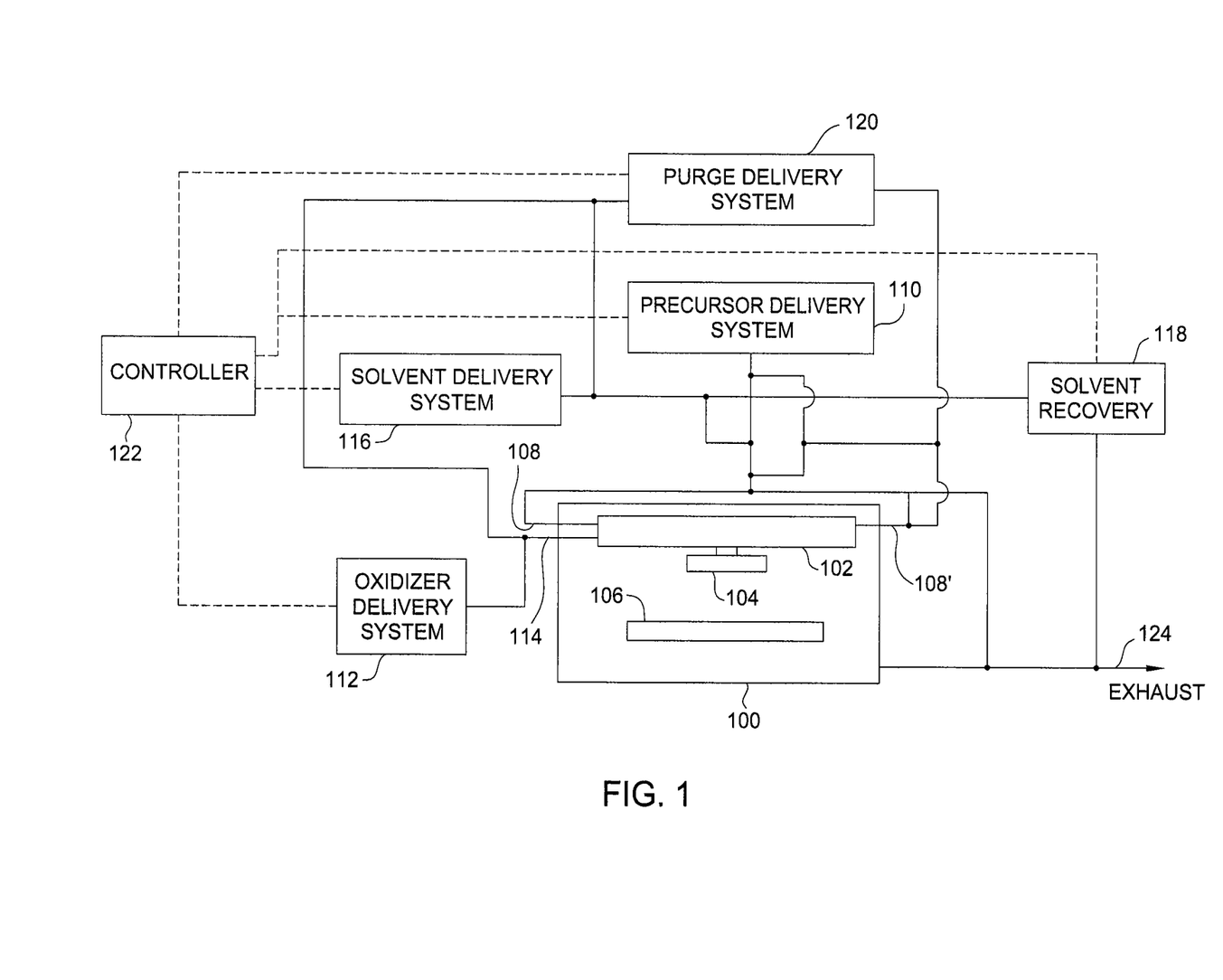
FIG. 1 is a schematic diagram of a process chamber and chemical delivery system according to one embodiment of the invention.

FIG. 1 is a schematic drawing of an ALD system in accordance with one embodiment of the invention. Chamber 100 is schematically depicted in cross-section, having a mixing block 102, gas distributor 104, and substrate support 106. an example of a chamber suitable for practicing embodiments of the invention is the CENTURA™ chamber available from Applied Materials, Inc., of Santa Clara, Calif. Mixing block 102 may be a substantially open space bounded by walls, or it may contain internal structures configured to promote mixing, such as baffles, channels, or vortex mixers. Use of a mixing block and gas distributor allows uniform distribution of precursor gases across the substrate when a single gas is provided to the chamber, and promotes mixing when multiple gases are provided. Gas may be provided to the mixing block through one or more portals in a way configured to provide the desired mixing. Gas enters the reaction space through gas distributor 104, and reacts with or adsorbs onto a substrate disposed onto substrate support 106. Gases may be provided through inlet portals 108 and 108', as shown in FIG. 1. Hafnium precursor may be delivered to chamber 100 using a precursor delivery subsystem 110.

Precursor delivery subsystem 110 is configured to deliver hafnium precursor to process chamber 100 as a vapor, while allowing flexibility to isolate the subsystem from the chamber for flushing or cleaning. Oxidizer may be delivered using oxidizer delivery subsystem 112, and may enter chamber 100 through the same portals 108 and 108', or preferably through a different portal 114. At convenient times during processing, precursor lines may be flushed with a suitable solvent to remove unwanted deposits from process gases. Solvent may be provided using solvent delivery subsystem 116, which may also utilize a solvent recovery system 118. Purge gas may be delivered from one or more purge gas sources using purge delivery system 120. Flows of all chemical components may be controlled using controller 122, and gases are exhausted through exhaust line 124 to a vacuum pump (not shown).

Figure 2:
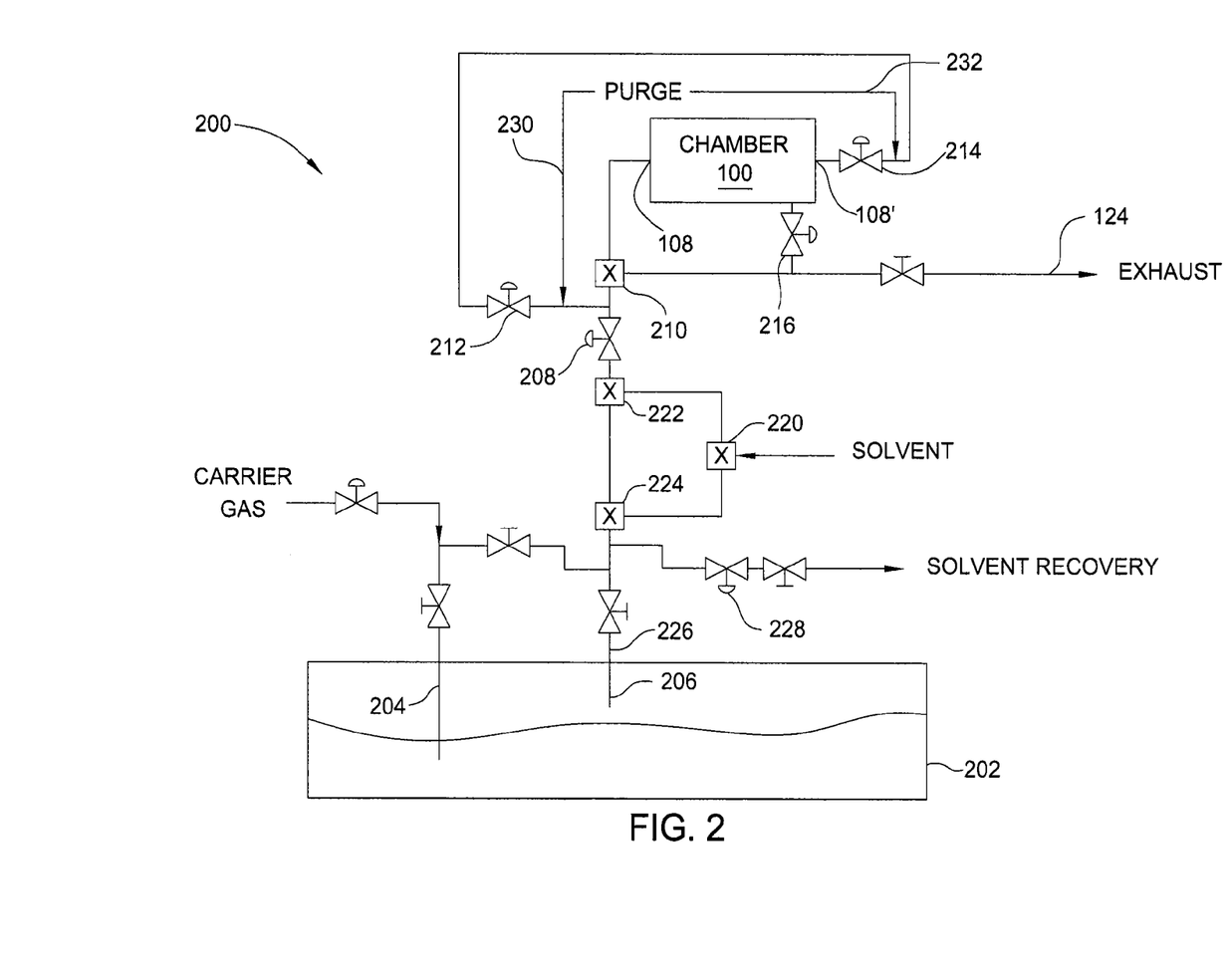
FIG. 2 is a schematic diagram of a chemical delivery system according to one embodiment of the invention.

FIG. 2 is a schematic diagram of a precursor delivery subsystem 200 in accordance with one embodiment of the invention. A deposition precursor, such as a hafnium precursor, is contained in one or more precursor source vessels such as ampoule 202. Carrier gas may be provided to transport precursor in the vapor phase from ampoule 202 to process chamber 100. Carrier gas is provided through inlet tube 204, and vaporized precursor is transported out of ampoule 202 through outlet tube 206 to precursor delivery line 226. Precursor may enter chamber 100 through portals 108 and 108', singly or in combination. Valve 208, which may be a remotely operated control valve, is used to control pulsing of precursor into the reaction space. Valve 210, which may also be a remotely operated control valve or, as in this embodiment, a remotely operated three-way valve, is used in combination with valve 212 to deliver precursor gas to the exhaust line 124, bypassing chamber 100, or to alternate inlet portal 108' through valve 214. Valve 216 may be used to control chamber pressure, and temperature may be monitored by thermocouple 218. Valves 220, 222, and 224 are provided to allow for solvent flushing of the precursor line to remove unwanted deposits. All valves described herein with reference to FIGS. 2-5 may be remotely or manually operated, and may be electronically or pneumatically actuated. Valves illustrated as coupling three pathways may additionally be three-way valves or co-operated two-way valves. Additional valve types may further be specified below as appropriate to particular duties.

Every portion of precursor delivery line 226 up to valve 210 may be flushed with solvent to ensure impurities are not imparted to substrates being processed. Solvent may be routed to recovery system 118 through control valve 228, if desired. Purge gas may be applied to both inlet portals 108 and 108' through purge lines 230 and 232. Purge gas may be applied while precursor gas is flowing into chamber 100 or only between pulses, if desired. Purge gas may be provided through inlet portals 108 and 108' into chamber 100, and then out through exhaust line 124 to purge all unreacted precursor from the system.

Figure 3:
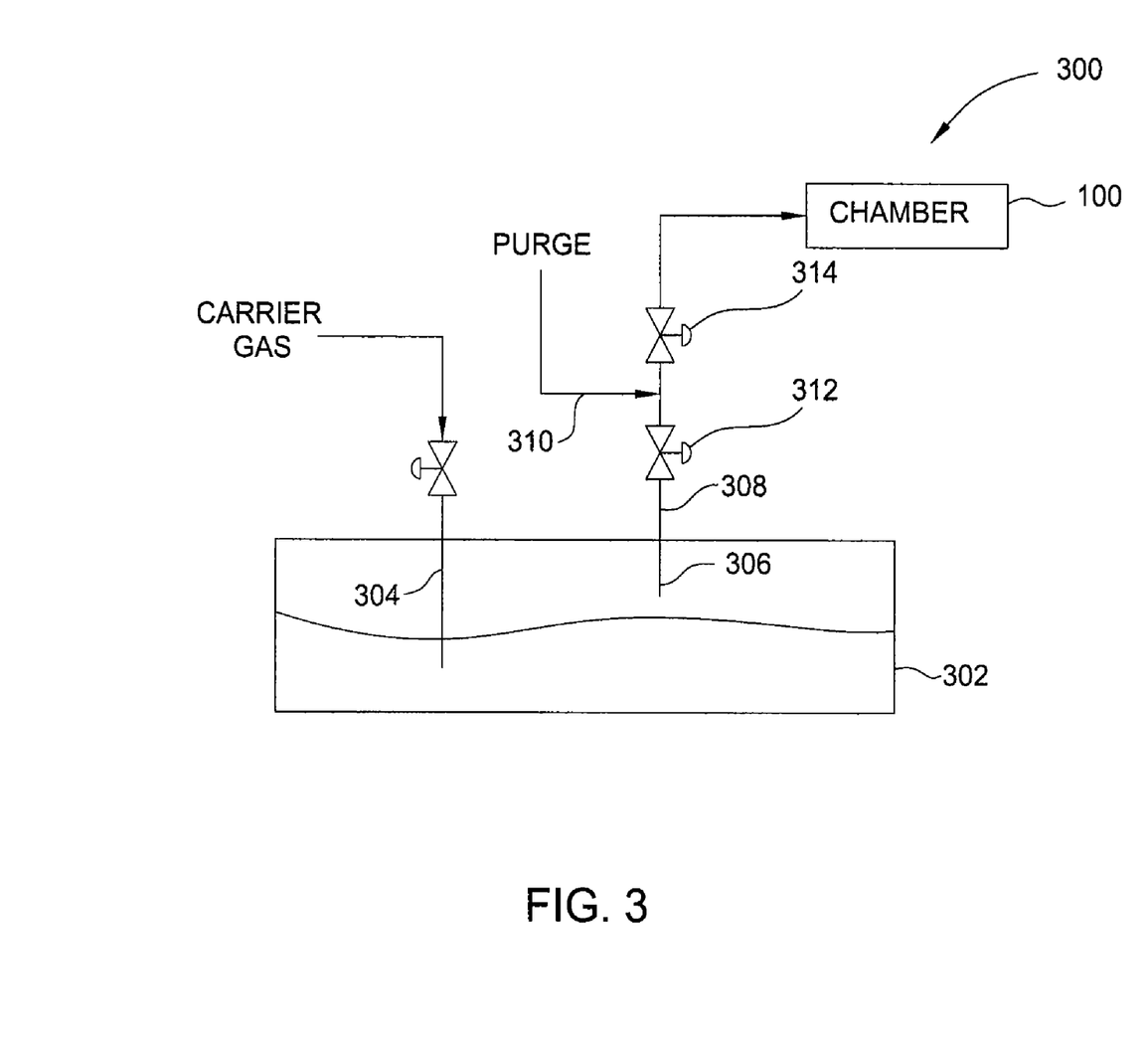
FIG. 3 is another schematic diagram of a chemical delivery system according to one embodiment of the invention.

FIG. 3 is a schematic diagram of an oxidizer delivery subsystem 300 in accordance with one embodiment of the invention. Oxidizer may be contained in one or more oxidizer source vessels such as ampoule 302. Carrier gas is provided through inlet tube 304, and vaporized oxidizer is transported out of ampoule 302 through outlet tube 306 to oxidizer delivery line 308. Purge gas may be delivered to the oxidizer delivery system through purge line 310, when valve 312 is closed and valve 314 is open, thus purging the oxidizer delivery line through inlet 114 into chamber 100 and out through 124, to purge all unreacted oxidizer from the system.

Figure 4:
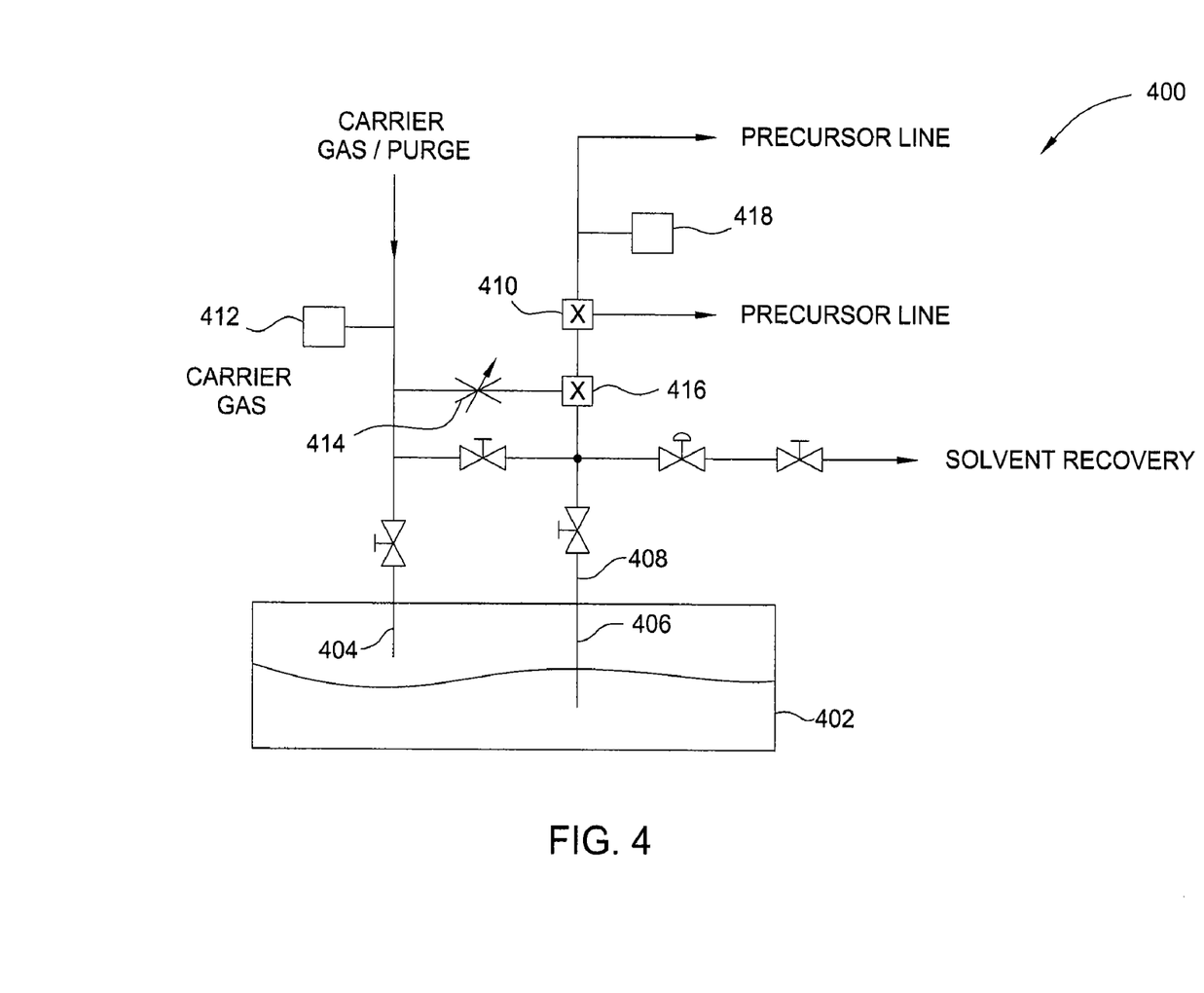
FIG. 4 is another schematic diagram of a chemical delivery system according to one embodiment of the invention.

FIG. 4 is a schematic diagram of a solvent delivery subsystem 400 in accordance with one embodiment of the invention. Solvent may be contained in one or more solvent source vessels such as ampoule 402. Carrier gas is provided through inlet tube 404, and solvent transported out of ampoule 402 through outlet tube 406 to solvent delivery line 408. Solvent is provided as a liquid by applying pressure through carrier gas inlet 404 to the head space of ampoule 402, forcing liquid to rise through outlet tube 406 into solvent delivery line 408. Solvent may be provided to one of two points on precursor delivery line by operation of valve 410, which may be a three-way valve. Referring back to FIG. 2, solvent may be provided to the precursor delivery line through valve 222 or valve 224. In one embodiment, solvent may be provided through valve 222, configured to block flow toward valve 208 and allow flow toward valve 224, to flush the precursor delivery line away from process chamber 100 into the solvent recovery system. In another embodiment, solvent may be provided through valve 224, configured to block flow toward valve 228 and allow flow toward valve 222, with valve 210 configured to block flow toward chamber 100 and allow flow toward the exhaust system, to flush the precursor line leading to chamber 100. Referring back to FIG. 4, control of flow rates may be assisted by use of pressure instruments 412 and 418. Instrument 418 may additionally be used to monitor deposit removal during solvent soak steps. Pressure fall in the precursor delivery line, detectable by instrument 418, indicates deposits are dissolving in the solvent and the process is not yet complete. Finally, valve 414, which may be a needle valve, and valve 416 may be provided to enable purge gas to flush solvent from the precursor delivery line to the solvent recovery or exhaust systems as needed.

Figure 5:
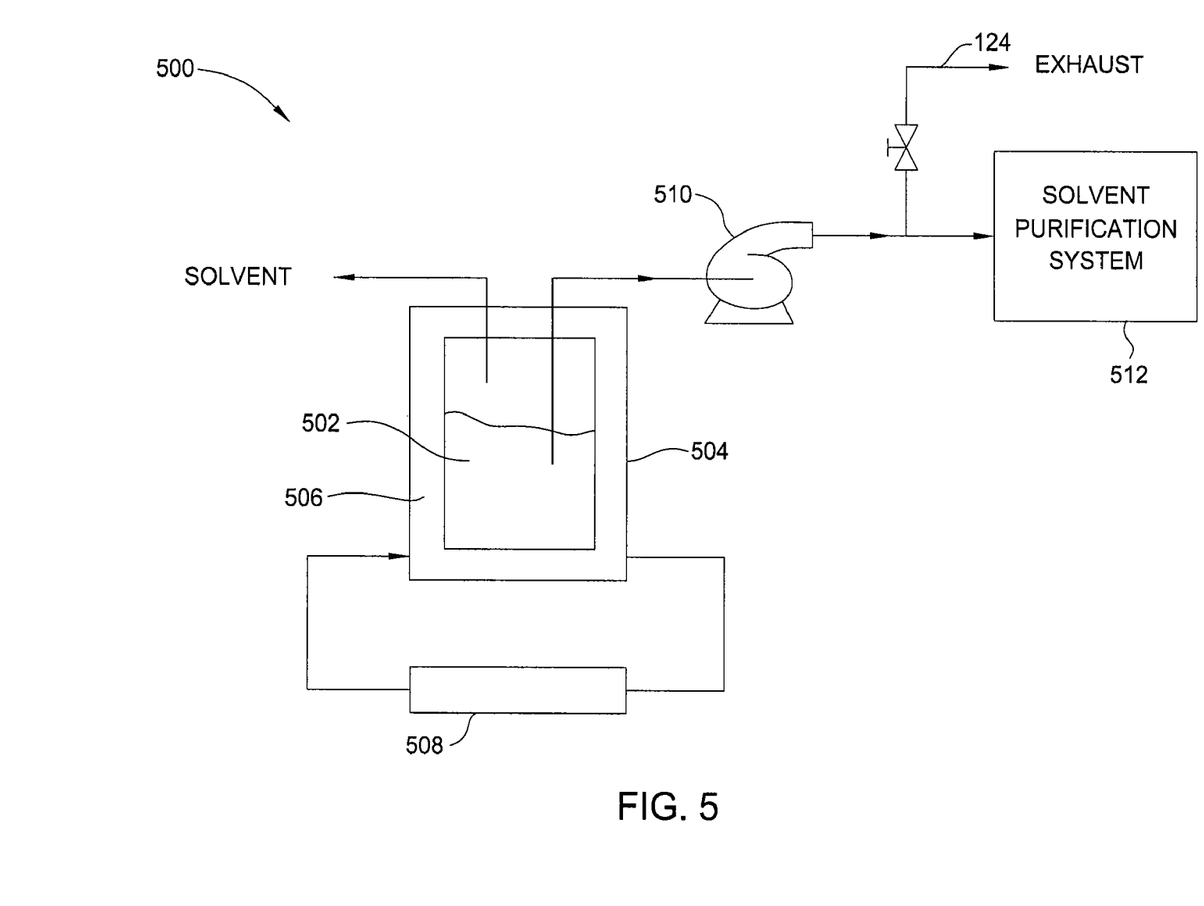
FIG. 5 is another schematic diagram of a chemical delivery system according to one embodiment of the invention.

FIG. 5 is a schematic diagram of a solvent recovery subsystem 500 in accordance with one embodiment of the invention. Solvent recovery subsystem may comprise a solvent removal unit coupled to any or all of the solvent flush pathways. In one embodiment, the solvent removal unit is a cooling unit. Solvent with particulates or dissolved deposits is provided to vessel 502, which may be surrounded by jacket 504. A cooling fluid 506 may be circulated through cooler 508 to jacket 504. Vapor pressure of the solvent is reduced by cooling so that solvent may be effectively pumped by pump 510 to solvent purification subsystem 512 or exhaust line 124. Cooling the solvent also provides the opportunity for dissolved deposits to precipitate in vessel 502. Solvent purification subsystem 512 may be any apparatus configured to remove unwanted components, such as moisture or oxygen containing components, from the solvent. Such purification system may operate by physical separation, such as distillation, chromatography, molecular sieve, or membrane filtration, or by chemical separation, such as ion exchange or catalytic purification. It should be noted that purification may be applied, if desired, to recycled solvent, as described above, or to solvent leaving solvent source vessel 402. If solvent is provided to vessel 402 from another source, purification may be performed on solvent as it is provided to vessel 402 as well. Embodiments of the invention provide for all combinations of the forgoing purification methods. Additionally, other embodiments provide for solvent flush facilities coupled to two deposition systems such that one may be flushed while the other performs a deposition process.

Facilities carrying precursors in the vapor phase may be insulated to prevent condensation or precipitation on the walls. Alternately, such facilities may be heated. Heating may be accomplished by use of a liquid or gas heat exchange apparatus, such as a heat jacket or multi-pass heat exchanger, or radiational heating. Jacketed or heat-exchange heating may be accomplished by co-flow or contra-flow of the heating medium. Depending on the degree of heating required, different heating media may be used. Standard media include steam or hot air, water, or oil. Electrical heating jackets that utilize resistive heating may also be used. Conversely, the entire apparatus may be heated, for example in a heated cabinet, with parts of the apparatus selectively cooled, if desired.

It is desirable to control the flow of all precursors, solvents, and purge gases strictly. Fugitive leaks of precursors can cause unwanted reactions in lines leading to the process chamber and in the distribution components of the process chamber, resulting in deposition of unwanted reaction products on walls of tubing, internal surfaces of the process chamber, and on a substrate disposed within the chamber. These deposition products may disrupt orderly deposition of layers on a substrate, leading to impurities or imperfection of deposited layers and loss of the self-limiting advantage of the ALD process. Tight shut-off valves, such as high-pressure ball, quarter-turn plug, or metal diaphragm valves, may be used to prevent leakage. Such valves may leak more with pressure in one direction than in another, so in delivery systems such as that described herein with potential flow in multiple directions, it may be advantageous to install double valves facing opposite directions to minimize any potential leakage. Tubing of very low roughness (e.g., Ra<0.25 μm) is advantageous for minimizing deposition on tubing walls.

Embodiments of the present invention provide a process for depositing a hafnium oxide layer using an apparatus such as that described above. A hafnium oxidation precursor is provided to a process chamber. Useful hafnium oxidation precursors include, but are not limited to, alkylamino hafnium compounds of general formula $(RR'N)_4Hf$, where R and R' are independent hydrogen or alkyl groups and may be the same or different. Such compounds include, but are not limited to, tetrakis-dimethylamino hafnium (TDMAH), tetrakis-diethylamino hafnium (TDEAH), tetrakis-methyl, ethylamino hafnium (TMEAH), and similar compounds wherein R or R' is a propyl, butyl, aryl, or other suitable group. The hafnium precursor is provided to the process chamber through a precursor delivery pathway in a pulse to deliver a predetermined amount of precursor to the process chamber. Purge gas may be provided continuously with the pulse or may be discontinued during the hafnium precursor pulse. For this embodiment, purge gas is generally a gas that is non-reactive or inert under process conditions, such as nitrogen ($N_2$) or helium (He). Moreover, the purge gas may be a purified purge gas, wherein moisture and oxygen containing species have been reduced below 10 ppm., such as below 1 ppm., using a gas purifier. At least a portion of the hafnium precursor will adsorb onto or react with the surface of a substrate disposed on a substrate in the process chamber, thus forming a layer on the substrate. Adsorption of the hafnium precursor depends on availability of adsorption sites. When these are all consumed, no more hafnium precursor will adsorb, and any remaining precursor is swept away by flowing purge gas or pumped out of the process chamber. The hafnium precursor generally reacts, in this embodiment, with hydroxyl groups (—OH) terminating the surface of the substrate to liberate hydrogen with two ligands, leaving the hafnium bonded to the oxygen on the surface of the substrate with remaining pendant ligands.

Following the pulse of hafnium precursor and the removal of any excess hafnium precursor, a pulse of an oxidizing agent is provided to the process chamber through one or more separate oxidizer delivery pathways. Exemplary oxygen precursors include, but are not limited to, water or steam ($H_2O$), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), alcohols (eg. ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds (eg., O, $O_2$, $O_3$, and OH radicals produced by heat, hot-wires, and/or plasma). The oxidizing agent reacts with adsorbed hafnium precursor, liberating remaining pendant ligands and leaving a layer of hydroxyl groups once again terminating the surface. Excess unreacted oxidizing agent is purged or pumped out, and the process begins again. Precursors are alternated in this fashion until the desired thickness of hafnium oxide film is reached.

Organic oxidizing agents are preferred over aqueous agents. Aqueous agents such as water or hydrogen peroxide have affinity for metal components of the process chamber, and are therefore difficult to purge to the level of purity required for ALD half-reactions. For example, it can take several minutes to an hour of purging with inert or non-reactive gas to evaporate all the aqueous species adsorbed onto the metal surfaces. Organic oxidizing agents, by contrast, generally have higher vapor pressure than aqueous agents, and are therefore easier to purge from the chamber.

Figure 6:
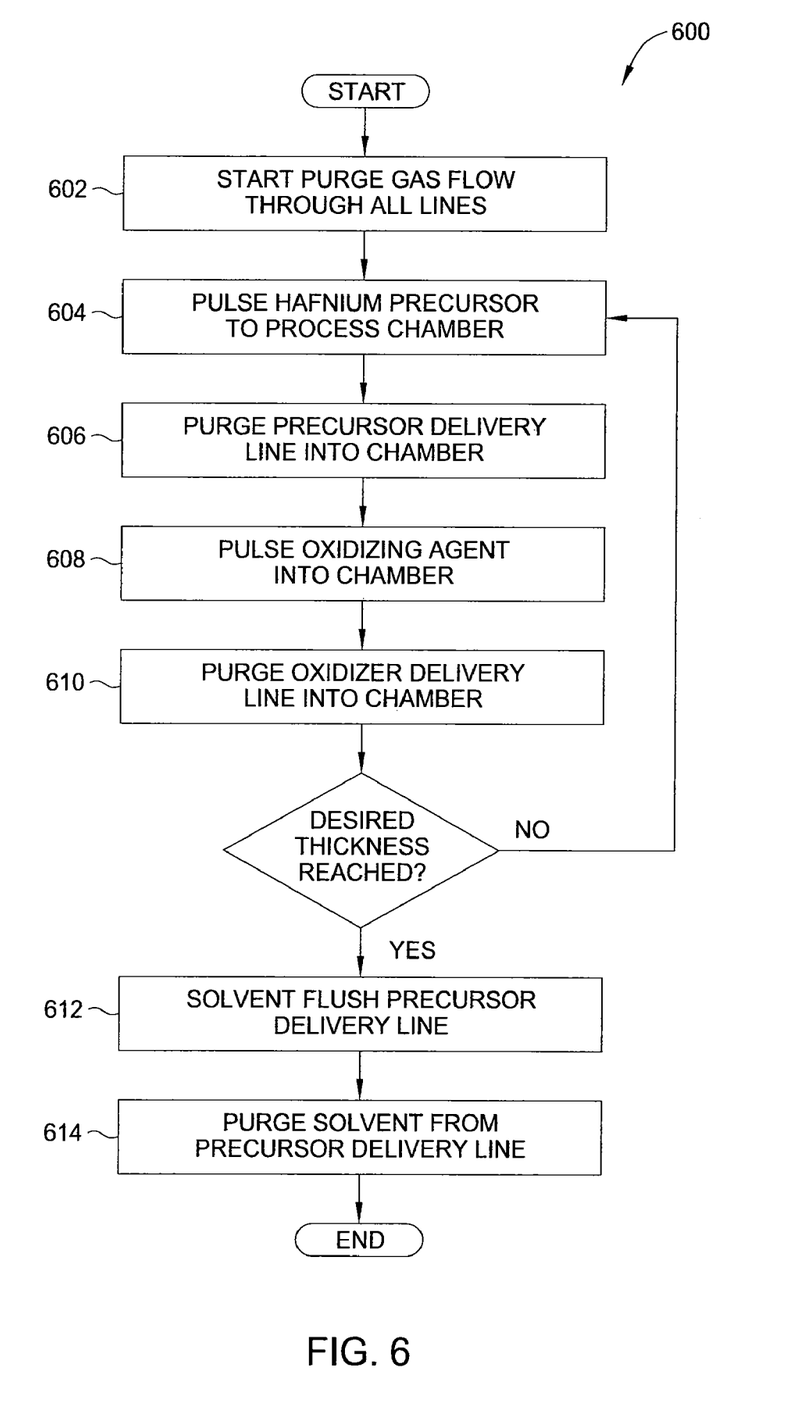
FIG. 6 is a process flow diagram according to one embodiment of the invention.

FIG. 6 is a process flow diagram illustrating a process according to one embodiment of the invention. The process 600 is an ALD deposition process using a hafnium precursor and an oxidizing agent to produce a conformal hafnium oxide film of a predetermined thickness. According to this embodiment, purge gas flow is first established through all precursor lines in step 602. This is advantageous for preventing back-flow of precursor through oxidizer lines or vice-versa during pulse steps. According to this embodiment, the chamber walls may be maintained at a temperature of between about 50° C. and 100° C., for example about 60° C., to minimize any wall condensation in the chamber. The hafnium precursor line may also be advantageously heated to a temperature of between about 50° C. and about 100° C., for example between about 70° C. and about 80° C., to minimize condensation on the one hand if the piping is too cool, or decomposition and deposition if the piping is too hot. The oxidizer line may advantageously be heated to a temperature between about 50° C. and about 100° C., for example about 90° C., depending on the oxidizer used, to minimize condensation of oxidizer in the oxidizer delivery line.

A hafnium precursor is provided to the process chamber in step 604 by pulsing a quantity of the precursor through the precursor delivery line into the process chamber. During the pulse, chamber pressure is maintained by adjusting control valves on the various purge gas lines using a controller in feedback mode with a pressure sensor. According to this embodiment, during the precursor pulse, the process chamber may be maintained at any pressure between about 70 millitorr (mtorr) and about 1000 mtorr. According to this embodiment, purge gas flow may be advantageously maintained through the oxidizer delivery line between about 0.7 and about 1.2 standard liters per minute (slm). If only one inlet portal is used to inject precursor, for example inlet portal 108, the chemical delivery system illustrated herein as one embodiment of the invention enables purge gas flow through alternate inlet portal 108' at an advantageous rate, for example between about 0.7 and 1.2 slm. Alternately, precursor may be pulsed through both portals 108 and 108'. Carrier gas may be provided at any advantageous rate, in this embodiment for example between about 0.25 and 0.5 slm. Flow rates of all compounds will of course depend on sizing of equipment and substrates in various embodiments. Pressures will vary according to particular design considerations, but the present invention encompasses embodiments in the pressure range given above.

The hafnium precursor adsorbs onto a substrate in the process chamber. According to this embodiment, excess precursor is removed from the chamber by the continuous flow of purge gas through the chamber. It should be noted that, while purge gas is shown being introduced to the chamber through the precursor and oxidizer lines only above the substrate, it may also be advantageous to introduce purge gas below the substrate to prevent any deposition on substrate edges, if desired, or on equipment below the substrate support. For example, in some embodiments, it may be desirable to locate the exhaust line above the substrate support and introduce purge gas below the substrate support to create an upward flow of purge gas preventing introduction of process gases below the substrate support.

The precursor delivery line is purged into the process chamber in step 606 to remove any remaining hafnium precursor in piping leading to the chamber. This prevents any unwanted reactions and deposition when oxidizer is pulsed. Purge gas flow is maintained through the hafnium precursor line while oxidizer is pulsed into the chamber in step 608. This prevents any back-flow of oxidizer into the hafnium precursor line, which would result in unwanted reaction and deposition when hafnium precursor is pulsed on the next cycle. Oxidizer reacts with adsorbed hafnium precursor to leave a layer of hafnium terminate with hydroxyl groups (—OH), liberating pendant ligands which are removed by the purge gas flow through the chamber. Excess oxidizer is also removed and the oxidizer delivery line is purged through the chamber in step 610 to remove any oxidizer from piping leading to the chamber.

If the desired thickness of the hafnium oxide layer has not yet been reached, the cycle is repeated until the end point is reached. At that time, a solvent flush may be performed on the precursor piping in step 612. The solvent flush is useful for removing any deposits resulting from fugitive reactions in the piping. Hydrocarbon solvents are generally preferred for this step, and may include solvents exhibiting moderate vapor pressure at the temperatures involved. In one embodiment, normal hexane is used as the solvent, and the temperature of the precursor delivery line is reduced to about 35° C. during solvent flushing. In an alternate embodiment, the solvent may be allowed to rest in the piping for a short time to ensure complete removal of deposits. As discussed above, the precursor delivery line may be flushed toward the process chamber, bypassing the chamber to the exhaust system, or away from the process chamber into the solvent recovery system. It is preferable to maximize flushing away from the process chamber to minimize the possibility of introducing solvent into the process chamber and to maximize the opportunity to recover solvent.

Any hydrocarbon solvent of suitable vapor pressure, such as hydrocarbons in the range of $C_6$-$C_{10}$ may be used, including normal and cyclic hexane isomers, normal and cyclic heptane isomers, normal and cyclic octane isomers, and aromatic compounds such as benzene, toluene, or xylene. Other solvents of moderate vapor pressure may also be used, provided they are generally non-reactive. Any solvent used must be of high purity generally, with very low moisture and oxygen compound impurities in particular. Moisture and compounds containing oxygen will promote reaction with fugitive quantities of hafnium precursor in the precursor delivery line, thus defeating the purpose of solvent flushing. Multiple solvent flush steps may be performed, with or without soak steps, to increase the cleaning. Moreover, with the delivery system embodiment illustrated herein, solvent flushing may be performed toward the process chamber, away from the process chamber, or in any combination thereof.

Although single use solvent, obtained in swappable ampoules, is preferred, solvent may be recovered and reused if desired. After flushing at elevated temperature, solvent bearing dissolved impurities may be purged in step 614 and provided to a cooling vessel to reduce its temperature and potentially precipitate some impurities. Reducing the temperature of the solvent reduces its vapor pressure for pumping to the recovery system. A jacketed vessel, such as that shown in FIG. 5 may be used, with coolant selected to provide a desired amount of cooling. Some examples are liquid nitrogen, liquid carbon dioxide, commercial coolants such as R-134a and R-410a, or liquid hydrocarbons, such as propane or propylene. Solvent may be re-purified through physical or chemical processes, as described above, such that impurities from the flushing operation are removed and any fugitive moisture or oxygen-containing compounds are removed.

Figure 7:
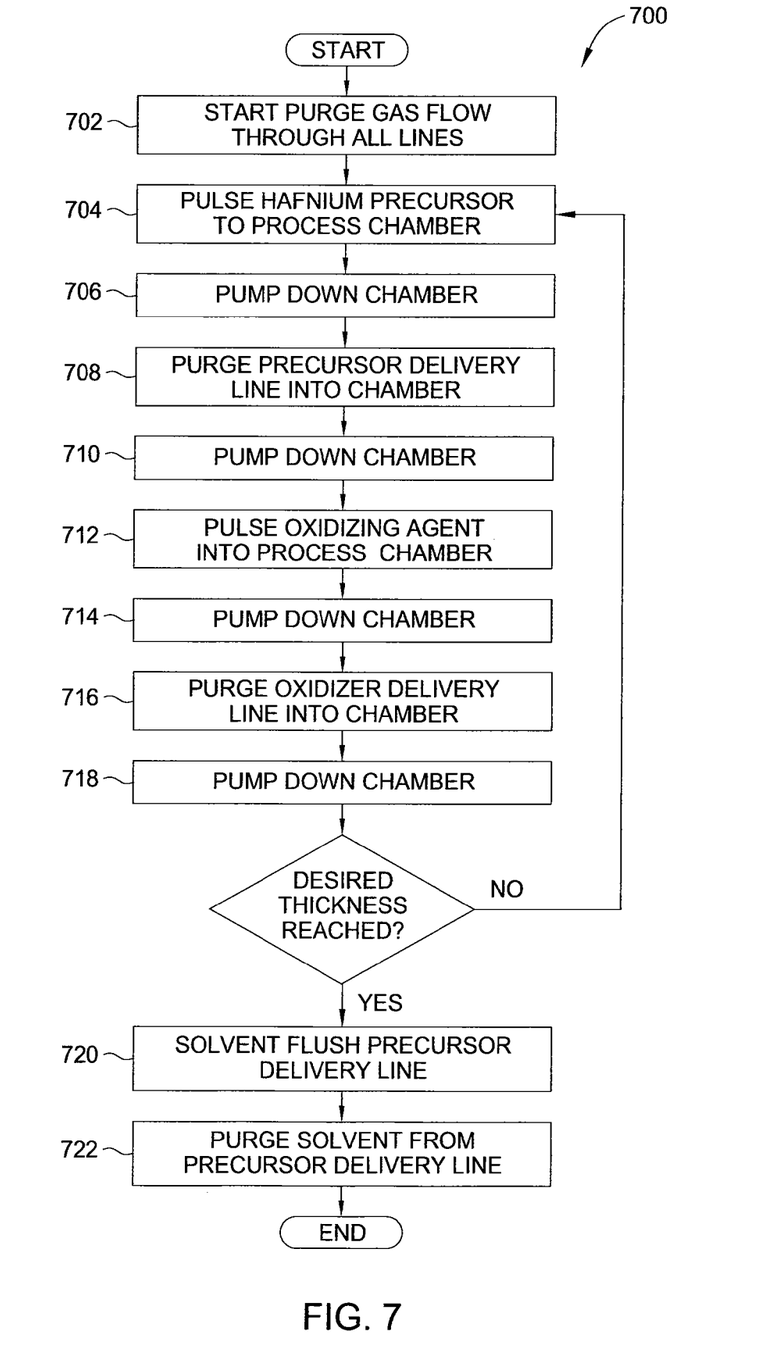
FIG. 7 is another process flow diagram according to one embodiment of the invention.

An alternative embodiment of an ALD process 700 is illustrated in the flow diagram of FIG. 7. In this process, purge gas is established through all lines in step 702. In both process 600 and process 700, pre-treatment steps are sometimes advantageous to prepare the surface of a substrate for the first precursor or material treatment. A substrate may be exposed to a reagent suitable for terminating the surface of the substrate with hydroxyl groups, for example. After hafnium precursor is pulsed into the chamber in step 704, excess is removed by pumping down the chamber in step 706. This is accomplished by restricting flow of purge gas to the chamber and allowing the vacuum pump to remove chamber contents. Any fugitive precursor clinging to chamber surfaces is thus encouraged to volatilize and exit the chamber. The precursor delivery line is purged into the chamber in step 708 to clear piping dead space, and the chamber is pumped down again in step 710 to remove any fugitive precursor adsorbed onto equipment from the piping purge. The pressure drop profile registered during step 710 also indicates whether additional purging is necessary because a slow pressure fall indicates deposits continue to release from chamber walls and piping. Likewise, after pulsing oxidizer, step 712, the chamber is pumped 714, the oxidizer line purged 716, and the chamber pumped again 718. These extra pumping steps reduce unwanted reactions between precursors adhering to chamber walls. The solvent flush steps 720 and 722 are provided again to remove deposits that build up in precursor piping over time.

The buildup of deposits in precursor piping is due to tiny leaks within standard tolerances for even tight shut-off valves. Leakage of precursors into piping dead space creates the opportunity for those precursors to react and deposit on piping walls. These fugitive leaks may be reduced, as discussed above, by using double valves. Furthermore, installing the double valves in opposite configurations may also reduce the possibility of leaks during operations requiring reverse flow directions.

While the foregoing is directed to embodiments of the present invention, other and further embodiments of the invention may be devised without departing from the basic scope thereof, and the scope thereof is determined by the claims that follow.

The invention claimed is:

1. A precursor delivery system for a deposition chamber, comprising:
   one or more precursor sources coupled to the chamber through one or more precursor delivery pathways;
   one or more oxidizer sources coupled to the chamber through one or more oxidizer delivery pathways;
   one or more purge gas sources coupled to the one or more precursor delivery pathways and the one or more oxidizer delivery pathways through one or more purge gas pathways; and
   one or more solvent sources coupled to the one or more precursor delivery pathways through one or more solvent flush pathways, wherein the precursor source contains an alkylamino hafnium compound of general formula $(RR'N)_4Hf$, where R is hydrogen or an alkyl group, and R' is hydrogen or an alkyl group, and the oxidizer source contains an alcohol of general formula ROH, where R is a methyl, ethyl, propyl, isopropyl, butyl, secondary butyl, or tertiary butyl group.

2. The system of claim 1, further comprising one or more purification systems coupled to the one or more solvent sources.

3. The system of claim 1, further comprising one or more purification systems coupled to the one or more solvent flush pathways.

4. The system of claim 1, further comprising a temperature control component coupled to at least one of the precursor delivery pathway, the oxidizer delivery pathway, and the deposition chamber.

5. An apparatus for depositing material on a substrate in a process chamber, comprising:
   one or more precursor delivery pathways connected to the process chamber;
   one or more oxidizer delivery pathways connected to the process chamber;
   one or more purge gas pathways connected to the one or more precursor delivery pathways and the one or more oxidizer delivery pathways;
   one or more solvent flush pathways connected to the one or more precursor delivery pathways;
   at least one solvent recovery unit coupled to the one or more precursor delivery pathways; and
   at least one purification system coupled to the one or more precursor delivery pathways, wherein the precursor delivery pathways communicate with a precursor source comprising an alkylamino hafnium compound of general formula $(RR'N)_4Hf$, where R is hydrogen or an alkyl group, and R' is hydrogen or an alkyl group.

6. The apparatus of claim 5, wherein the oxidizer delivery pathways communicate with an oxidizer source comprising an alcohol of general formula ROH, where R is a methyl, ethyl, propyl, isopropyl, butyl, secondary butyl, or tertiary butyl group.

7. The apparatus of claim 6, wherein at least a portion of the precursor pathways have walls with $R_a$ roughness less than about 0.25 µm.

* * * * *